United States Patent [19]
Carl et al.

[11] 3,990,770
[45] Nov. 9, 1976

[54] ELECTRO-OPTIC PICTURE DISPLAY AND MEMORY DEVICE

[75] Inventors: Klaus Friedrich Leonhard Carl; Karl Heinz Hardtl, both of Aachen, Germany

[73] Assignee: U.S. Philips Corporation, New York, N.Y.

[22] Filed: Mar. 24, 1975

[21] Appl. No.: 561,415

Related U.S. Application Data

[63] Continuation of Ser. No. 374,659, June 28, 1973, abandoned.

[30] Foreign Application Priority Data

July 13, 1972  Germany............................ 2234455

[52] U.S. Cl............................ 350/150; 350/160 R; 340/173.2
[51] Int. Cl.².................... G02F 1/20; G11C 11/22
[58] Field of Search............... 350/160 P, 150, 149, 350/160 R; 340/173.2, 173 LT, 173 LM

[56] References Cited
UNITED STATES PATENTS 3,531,182  9/1970  Land et al................ 340/173.2 X
3,609,002  9/1971  Fraser............................ 350/150

OTHER PUBLICATIONS

Maldonado, J. R.; Meitzler, Allan H., "Strained-Biased Ferroelectric-Photoconductor Image Storage and Display Devices" Proceedings of the IEEE, vol. 59, No. 3, Mar. 1971, pp. 368–382.

Primary Examiner—John K. Corbin
Assistant Examiner—Rolf Hille
Attorney, Agent, or Firm—Frank R. Trifari; Carl P. Steinhauser

[57] ABSTRACT

An electro-optic picture display and memory device employs a material which has the property of field-induced ferroelectricity such as lanthanum-containing mixed crystals of lead zirconate and lead titanate. Remanent storage is achieved in that certain electrodes on the plate are separated from the signal generator while the signal voltage is still present.

5 Claims, 13 Drawing Figures

ELECTRO-OPTIC PICTURE DISPLAY AND MEMORY DEVICE

This is a continuation of application Ser. No. 374,659, filed June 28, 1973, now abandoned.

The invention relates to an electro-optic picture display and memory device comprising a plate which, under the influence of an electric field between electrodes present on the plate, shoes double refraction.

Such a device is known from the article "Ferroelectric display's big bonus: selective erase/write capability" in "Electronics" of Feb. 1, 1971, pp. 34–39. In this article a device is described which comprises a plate of lanthanum-doped lead titanate-lead zirconateceramic. The plate consists of a transparent ferroelectric ceramic which has a high remanent polarization and is electro-optically active. A permanent condition of optic anisotropy can be adjusted by a short electric field pulse — in accordance with the nature of the electrode configuration used locally or in the whole plate. The direction of the active electric field component lies in the plane of the ceramic plate and the light distribution occurs perpendicularly to the plane of the plate (transversal electro-optic effect). The information written as a variation in the birefringence can in principle be erased in that the ferro-electric ceramic plate and its individual picture elements, respectively, are heated above the Curie temperature of the material, an optically isotropic condition is then again adjusted. In the above-stated article, the problem of "writing-erasing" is solved by means of a bias tension may be may both of an electrical and a mechanical nature. This bias voltage or bias stress results in a uniaxial preferred orientation of the polar axes in the plane of the plate and hence an optically anisotropic starting condition of the plate. Information is written in that a suitable electric field is applied which orients the polar axes of local elements (more or less completely) perpendicularly to the plane of the plate: as a result of this, a remanent state of a small optical anistropy (that is to say a small birefringence) is adjusted in said elements. For erasing the information, a special erasing cycle has to be introduced which switches back again the polar axes of the elements — in accordance with the initial condition — in the plane of the plate.

It is the object of the invention to provide a simpler device of the type described in the introduction. It is characterized in that the plate consists substantially of a material which has the property of the field-induced ferroelectricity — the so-called quasi-ferroelectric behaviour —, that remanent storage of information is achieved in that the electrodes (of one or several elements) are separated from the signal generator while the signal voltage is still present, and that the stored information — while using a typical property of quasi-ferroelectric materials — is erased by short-circuiting electrodes. Quasi-ferroelectric materials are characterized in that an electric field induces in them a ferroelectric condition of electrical and optical anisotropy. This condition, however, is unstable when the electric field is switched off and is reduced to the isotropic initial condition. The time constant of said process depends upon the electric boundary conditions and can be influenced externally. Quasi-ferroelectric materials permit achieving similarly high electro-optic effects as with ferroelectric materials. For writing information electric field pulses serve which switch individual surface elements of the ceramic plate from an optically isotropic into an optically anisotropic condition. Remanent storage of information is achieved in the proposed device in that the electrodes serving to switch a surface element of the ceramic plate are separated from the pulse generator mechanically or electronically while the field pulse is still present. Thus, the full voltage is at first still set up at the ceramic electrode unit which is to be considered as a stongly non-linear capacity. To the same extent as this voltage decays in accordance with the time constant of the capacity, the field-induced polarization condition will try to decrease. Charges are released which further maintain the electric field across the capacity. Due to the large density which is associated with the field-induced polarization condition (in which the stongly non-linear behaviour of the dielectric constant plays a part), the reduction process of the optically anisotropic condition of the ceramic is delayed to quasi-static times of minutes and longer. When the witten and stored information is to be erased, it is sufficient to short-circuit the electrodes of the ceramic electrode unit for a short period of time. The field-induced, ferroelectric and optically anisotropic condition of the unit then is reduced to the isotropic initial condition. Also new information can be written, without previous erasing, by a new field pulse.

Quasi-ferroelectric materials which are particularly suitable for a device according to the invention consist essentially of lanthanum-containing mixed crystals of lead zirconate and lead titanate of the formula $(Pb_{1-1.5y}La_y)(Zr_xTi_{1-x})O_3$. That special compositions of this material have the property of the field-induced ferroelectricity is already described on page 306 of the article "Improved hot-pressed electro-optic ceramics in the (Pb, La) (Zr,Ti)O$_3$ System" in "Journal of the American Ceramic Society", 54, June 1971, p. 303 et seq. The special suitability of these materials for a device according to the invention, however, is not stated in this article.

Preferred compositions of the material of the plate, expressed in $x$ and $y$ of the gross formula $(Pb_{1-1.5y}La_y)(Zr_xTi_{1-x})O_3$ lie in a rectangular $x$-$y$ system of coordinates (origin : $x = 0$; $y = 0$) within a quadrangle written by the points A($x = 0.1$; $y = 0.2$), B($x = 0.1$; $y = 0.25$), C($x = 0.8$; $y = 0.1$) and D($x = 0.8$; $y = 0.05$) or, more restricted, within a quadrangle written by the points E($x = 0.6$; $y = 0.095$), F($x = 0.6$; $y = 0.125$), G($x = 0.7$; $y = 0.1$) and H($x = 0.7$; $y = 0.075$). The composition K($x = 0.65$; $y = 0.09$) has proved to be very suitable.

The invention will now be described in greater detail with reference to the accompanying drawing:

FIGS. 1, 2 and 3 show the respective dielectric, ferroelectric and electro-optic behaviours, respectively, of lanthanum-containing lead zirconate-lead titanate mixed crystals of different compositions.

FIG. 4 serves to explain the composition of those materials which are suitable for a device according to the invention.

Figure 1A:
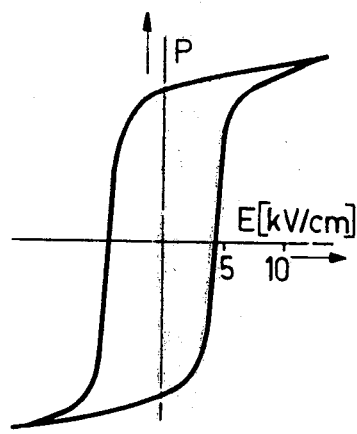
Figure 2A:
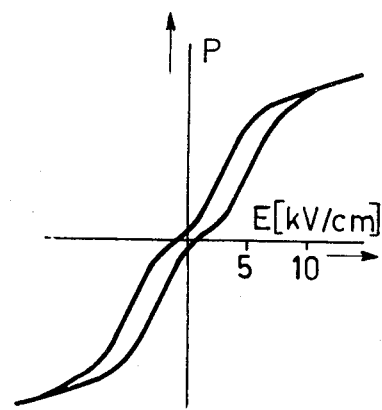
Figure 1B:
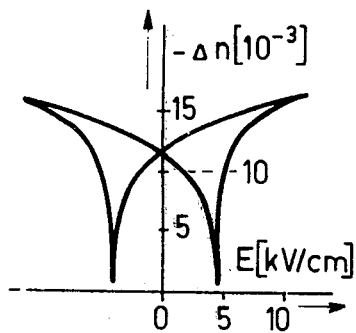
Figure 2B:
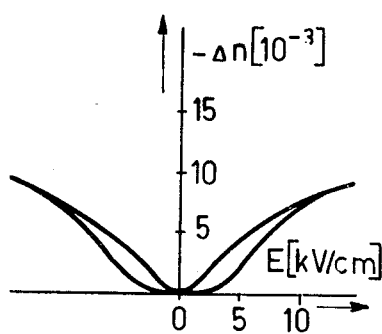
Figure 3A:
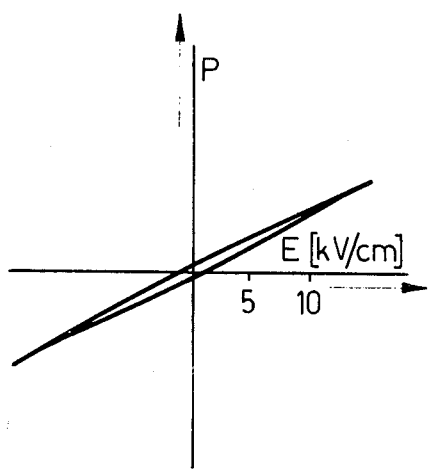
Figure 3B:
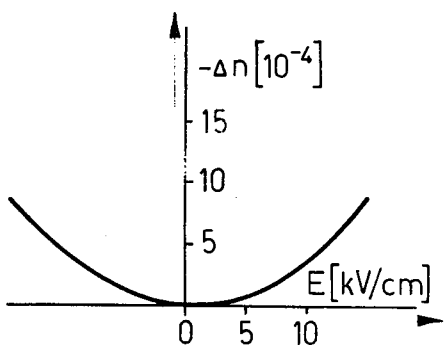

FIGS. 1, 2 and 3 show the dielectric and ferroelectric and electro-optic behaviours, respectively, of three lanthanum-containing lead titanate-lead zirconate ceramics of different compositions. FIG. 1 shows the behaviour of a ferroelectric material, FIG. 2 the behaviour of a quasi-ferroelectric material (field-induced ferroelectricity) and FIG. 3 the behaviour of a paraelectric material. In FIGS. 1a, 2a, and 3a, the polarization P is plotted as a function of the electric field strength E. The electric field strength E is measured in kV/cm and the polarization in units of charge per surface unit of an order of magnitude which is not exactly known, since for the polarization only relative measurements were possible. In FIGS. 1b, 2b and 3b the effective birefringence $\Delta n$ of the transversal electro-optic effect is plotted as a function of the electric field strength E. $\Delta n$ is a measure of the optic anisotropy of the materials and is defined as a difference of the index of refraction $n_1$ and $n_2$. $n_1$ is the index of refraction for light having a direction of polarization parallel to the direction of the electric field and $n_2$ is the index of refraction for light having a direction of polarization perpendicular to the direction of the electric field. As shown in FIGS. 2a and 2b, the polarization and the effective birefringence of quasi-ferroelectric materials increase strongly when a certain electric field strength is exceeded and this antisotropic condition is reduced again with decreasing electric field before E = 0 is reached. (field induced ferroelectricity).

Figure 4:
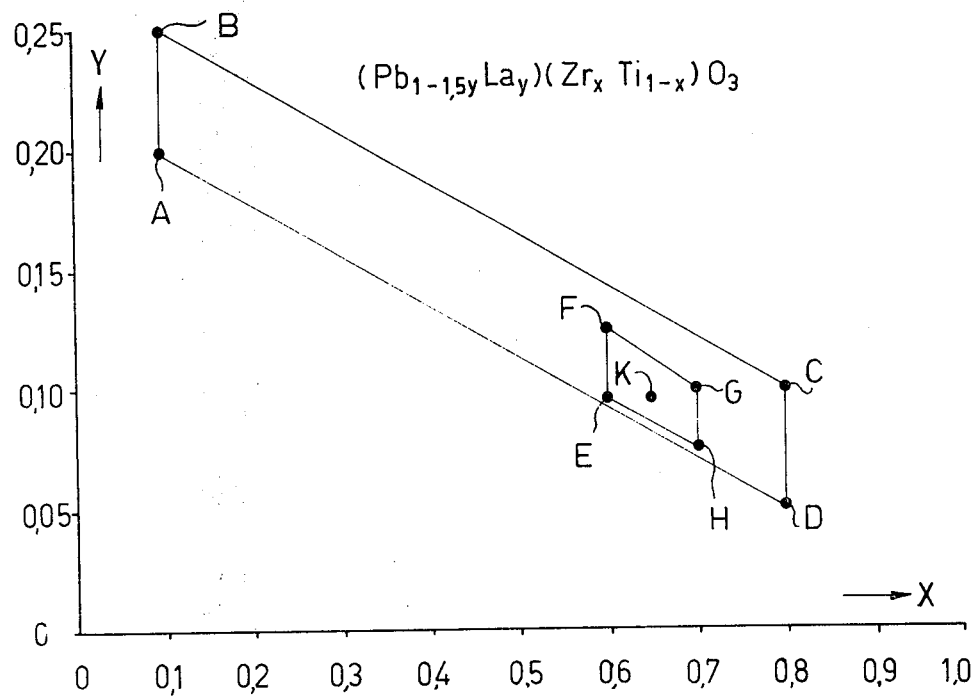

FIG. 4 shows the range of compositions of quasi-ferroelectric $(Pb_{1-1.5y}La_y)(Zr_xTi_{1-x})O_3$ mixed crystals. From this gross formula it will be obvious that the lanthanum ions land in Pb places of the PbZrO$_3$/PbTiO$_3$-lattice. Since lanthanum is trivalent and lead is bivalent, each $La^{3+}$ ion occupies 1.5 $Pb^{2+}$ places. The points A, B, C and D define in FIG. 4 a quadrangle within which the compositions $x$ and $y$ of those materials lie which are quasi-ferroelectric at room temperature. Materials which are particularly suitable for a device according to the invention lie within the range of compositions defined by the points EFGH; the composition denoted by K has proved to be particularly favourable.

Figure 5:
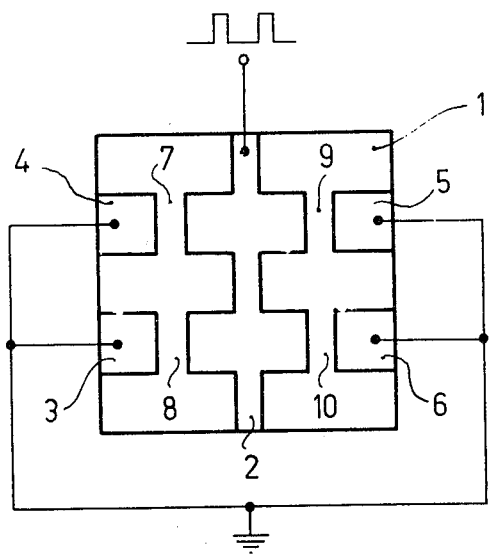
FIG. 5 shows a test plate with which the life of the material K(FIG. 4) was tested against electric pulse field load.

FIG. 5 shows a test plate with which the life of the material shown in FIG. 4 by point K was tested for electric pulse field load. Actually, when electric field pulses are repeatedly applied to a ferro-electric ceramic, the mechanical stresses and deformations associated with the repolarization usually result in a degradation: the samples show cracks and their physical properties vary drastically. With a $(Pb_{0.865}La_{0.09})(Zr_{0.65}Ti_{0.35})O_3$-ceramic, the following degradation test was therefore carried out. The test plate itself is denoted by 1 in FIG. 5; it comprises electrodes 2, 3, 4, 5 and 6. The electrodes 3, 4, 5 and 6 are connected to ground in common. Front and rear sides of the 0.2 mm thick plate have the same electrode configuration; corresponding electrodes of front and rear side are connected together. The gaps 7, 8, 9 and 10 between the electrodes (gap width 0.5 mm) represent the picture elements. The pulse voltage is applied between electrode 2 and the grounded electrodes 3, 4, 5 and 6. The pulse voltage was 400 V, the pulse duration 50 $\mu$sec and the pulse recurrence frequency 1 kHz. After $10^9$ switching cycles, degradation was observed neither in the switching behaviour nor in the properties P(E) or $\Delta n(E)$ (FIGS. 2a and 2b).

Figure 6:
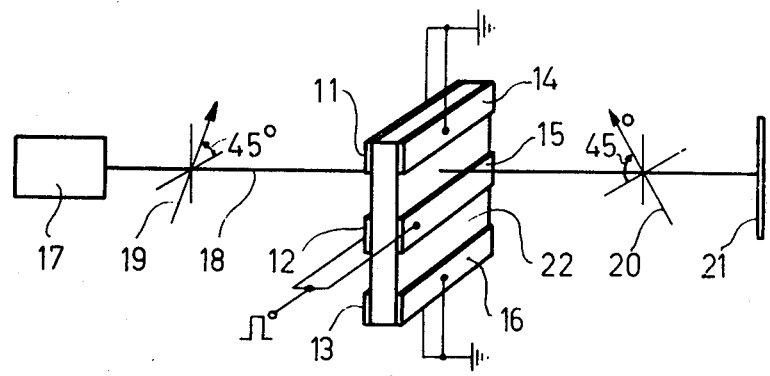
FIG. 6 shows a test arrangement for optic measurements.

FIG. 6 shows the test arrangement use for carrying out optical measurements. The ceramic plate 22 comprises electrodes 11, 12, 13, 14, 15 and 16 which, as shown in FIG. 6, are partly connected together. The pulse voltage is applied between the electrode pair 12/15 and the grounded electrode pair 11/14. A He-Ne-laser 17 of wavelength $\lambda = 6328$ A which supplies the beam 18 served as a light source. 19 denotes a polarizer and 20 an analyzer. The directions of oscillation of polarizer and analyzer enclose an angle of 45° with the direction of the electric field and an angle of 90° with each other. Observed and measured, respectively, are the intensity of the light impinging upon a screen an detector 21, respectively, in accordance with the electric field E between the electrodes 12/15 and 11/14. When the plate 1 is in the optically isotropic condition ($\Delta n = 0$), no light impinges upon the screen and detector 21, respectively. Only the electric field induces an optically anisotropic condition $\Delta n = 0$, so that brightening of the screen begins.

The intensity impinging on the detector 21 in the arrangement shown in FIG. 6 is, as is known, $I = I_o \sin^2(\Gamma/2)$, where $\Gamma$ is the phase difference of the light beam polarized perpendicular to and parallel to the electric field direction after the passage of the plate 11. In units of $\lambda$, $\Gamma$ is given by $\Gamma = \Delta n \cdot t$, where $t$ is the thickness of the sample. In the arrangement shown in FIG. 6, the first brightness maximum ($\Gamma = \lambda/2$) occurred at E $\approx$ 5kV/cm with $\lambda = 6328$ A. When the sample is switched to an optically anisotropic condition (for example $\Gamma = \lambda/2$) with an electric field pulse, and the sample is separated from the voltage source while the field pulse is still present, the reduction operation of this optically anisotropic condition is delayed to quasi-static times. In the arrangement shown in FIG. 6 the intensity of the first brightness maximum of an electrically open sample reduced in approximately 8 minutes to half of its original value. When the sample was separated from the pulse generator, the field-induced, optically anisotropic condition reduced to the optically isotropic condition within the decay time of the voltage pulse which has a few $10^6$ sec.

A compensator which in the arrangement shown in FIG. 6 was present between the polarizer 19 and the sample 22 served to measure the effective double refraction in accordance with the electric field (FIG. 2b). Curves as shown in FIGS. 2a and 2b were measured under static conditions. The effective birefringence $\Delta n$ which is achievable under dynamic conditions (that is to say with electric pulse fields) may differ from the statically measured values. For example, the achievable double refraction does not depend only upon the height of the electric field pulse but also upon its duration.

Figure 7:
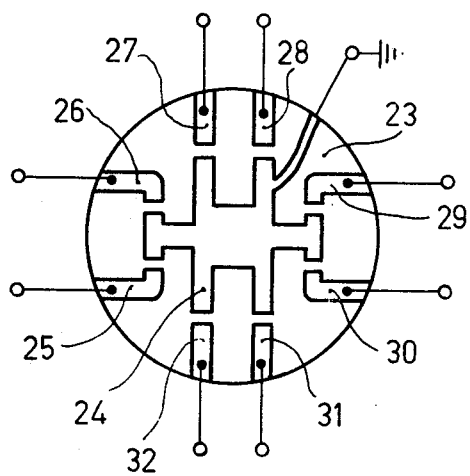
FIG. 7 shows a possible electrode configuration for a device according to the invention.

FIG. 7 shows the geometry and electrode configuration of a ceramic plate for a device according to the invention, namely for a special device having eight picture elements. Front and rear side of the ceramic plate 23 comprise the same electrode configuration. Corresponding electrodes on front and rear side are connected together. The gap between the grounded central electrode 24 and the control electrodes 25–32 represent the picture elements. This picture elements are switched "on" and "off" by means of electric voltage pulses which are applied between the central electrode and the control electrodes; the drive of each element occurs by a known program generator connected with a pulse generator. "On" means brightness, "off" means darkness; erasing occurs by a short-lasting short-circuit of the relevant control electrode with the central electrode 24.

Figure 8A:
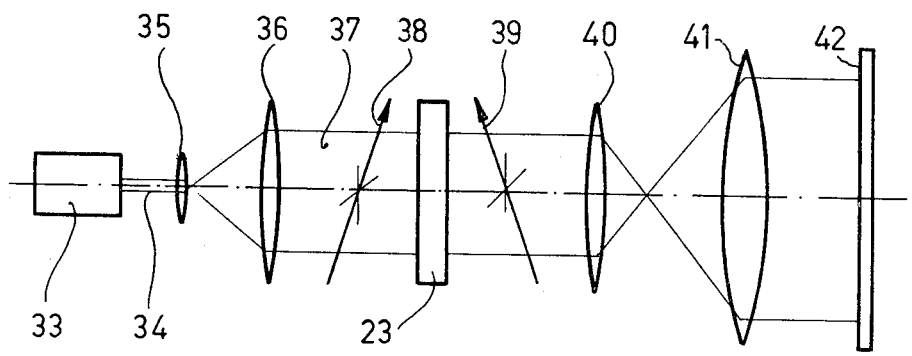
FIG. 8 shows two experimental arrangements for the optic display of information which is read and stored electrically in a ceramic plate. The ceramic plate represents a device according to the invention and comprises a suitable electrode system (for example, of the type shown in FIGS. 6, 7 or 9).

FIG. 8a shows an arrangement for the visual reproduction of the information written electrically in a ceramic plate, for example, as shown in FIG. 7. The ceramic plate is denoted by 23. A He-Ne-laser 33 produces a light beam 34 which is fanned in a wide parallel beam 37 by the lenses 35 and 36. Beam 37 passes a diagrammatically shown polarizer 38, the ceramic plate 23, a diagrammatically shown analyzer 39 and is projected on a screen 42 by the lenses 40 and 41. The directions of polarization of the polarizer 38 and analyzer 39 are normal to each other in known manner; they enclose an angle of 45° with the direction of the electric field. The driven picture elements form an elliptically polarized light beam from the linearly polarized light beam leaving the polarizer 38, so that after passage of the analyser 39 only the driven picture elements are projected on the screen 42 as bright surfaces.

Figure 8B:
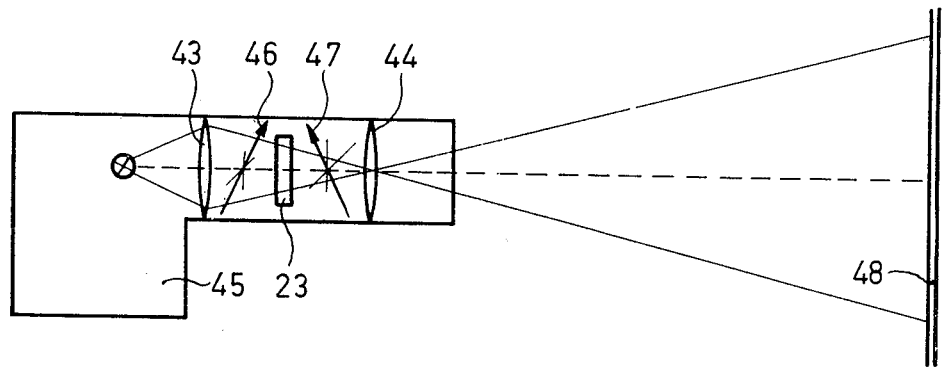

FIG. 8b shows another arrangement for the visual reproduction of the information written electrically in a ceramic plate, for example shown in FIG. 7. The ceramic plate 23 is present between the condenser lens 43 and the objective lens 44 of a projection apparatus 45 (for example diaprojector). Immediately in front of and behind the ceramic plate 23 are arranged in crossed arrangement a polarizer 46 and an analyzer 47; in this case also, only the driven picture elements are projected on the screen 48 as bright surfaces.

Figure 9:
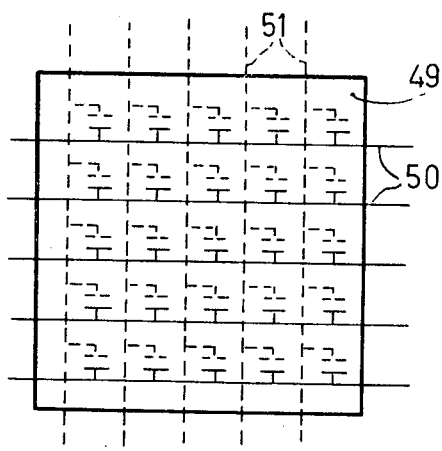
FIG. 9 shows another possible electrode configuration (cross-bar system) for a device according to the invention.

FIG. 9 shows an electrode configuration which is particularly suitable for an electro-optic picture display and storage device having a larger number of picture elements. This configuration shows a known so-called "cross-bar" electrode system. 49 denotes the ceramic plate and 50 and 51, respectively, denote the system of conductor tracks and electrodes on the front and rear sides of the ceramic plates. In this case an indentical electrode configuration on the front and rear sides is not used. The operative electrode field is the field component in the plane of the plate. In order to avoid capacitive crosstalk of several conductor tracks and brightening of zones other than the driven picture elements, it is preferable to separate the ceramic plate and the electrode system partly by an insulating dielectric intermediate layer of low dielectric constant.

What is claimed is:

1. An electro-optic picture display and memory device for storage and display of information by direct read-out comprising a plate of quasi-ferroelectric material in which ferroelectricity is field-induced and produces double refraction of light, electrodes on said plate, means to apply a potential between selected electrodes on said plate, means to remove said potential while a field pulse is still present to induce remanent storage of information in said plate, and means to short-circuit said electrodes to erase information stored in said plate.

2. An electro-optic picture display and memory device as claimed in claim 1, wherein the plate consists essentially of lanthanum-containing mixed crystals of lead zirconate and lead titanate of the formula $(Pb_{1-1.5y}La_y)(Zr_xTi_{1-x})O_3$.

3. An electro-optic picture display and memory device as claimed in claim 2, wherein composition of the plate, expressed in $x$ and $y$ in a rectangular system of coordinates with origin $x = 0$ and $y = 0$ lies within a quadrangle described by the points $A(x=0.1; y=0.2)$, $B(x=0.1; y=0.25)$, $C(x=0.8; y=0.1)$ and $D(x=0.8; y=0.05)$.

4. An electro-optic picture display and memory device as claimed in claim 3, wherein composition of the plate expressed in $x$ and $y$ in a rectangular system of coordinates with origin $x = 0$ and $y = 0$ lies within a quadrangle described by the points $E(x = 0.6; y = 0.095)$, $F(x = 0.6; y = 0.125)$, $G(x = 0.7; y = 0.1)$ and $H(x = 0.7; y = 0.075)$.

5. An electro-optic picture display and memory device as claimed in claim 4, wherein for the composition of the plate, expressed in $x$ and is $x=0.65; y=0.09$.

* * * * *